(12) United States Patent
Takano et al.

(10) Patent No.: US 10,770,397 B2
(45) Date of Patent: Sep. 8, 2020

(54) SEMICONDUCTOR MODULE

(71) Applicant: Taiyo Yuden Co., Ltd., Tokyo (JP)

(72) Inventors: Takayuki Takano, Tokyo (JP); Yuichi Sasajima, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 16/515,625

(22) Filed: Jul. 18, 2019

(65) Prior Publication Data
US 2020/0027836 A1 Jan. 23, 2020

(30) Foreign Application Priority Data
Jul. 18, 2018 (JP) ................................ 2018-134845

(51) Int. Cl.
*H01L 23/538* (2006.01)
*H01L 25/065* (2006.01)
*H01L 23/31* (2006.01)

(52) U.S. Cl.
CPC ...... *H01L 23/5384* (2013.01); *H01L 23/3142* (2013.01); *H01L 23/5385* (2013.01); *H01L 23/5386* (2013.01); *H01L 25/0655* (2013.01)

(58) Field of Classification Search
CPC ............. H01L 23/5384; H01L 25/0655; H01L 23/3142; H01L 23/5385; H01L 23/5386
See application file for complete search history.

(56) References Cited

U.S. PATENT DOCUMENTS

| | | | | |
|---|---|---|---|---|
| 2007/0215903 A1* | 9/2007 | Sakamoto | ......... | H01L 23/49844 257/192 |
| 2009/0194857 A1* | 8/2009 | Liu | ................ | H01L 23/49844 257/676 |
| 2011/0147058 A1* | 6/2011 | Kawano | ............... | H05K 3/4682 174/257 |
| 2015/0115458 A1* | 4/2015 | Palm | .................. | H01L 23/5389 257/774 |
| 2015/0116022 A1* | 4/2015 | Hughes | ................ | H01L 23/645 327/374 |
| 2015/0255418 A1* | 9/2015 | Gowda | ................ | H01L 23/373 257/690 |
| 2019/0115305 A1* | 4/2019 | Lin | ..................... | H01L 23/5386 |
| 2019/0385977 A1* | 12/2019 | Elsherbini | .............. | H01L 25/50 |

FOREIGN PATENT DOCUMENTS

JP 2015-170855 A 9/2015

\* cited by examiner

*Primary Examiner* — Victor A Mandala
(74) *Attorney, Agent, or Firm* — Saliwanchik, Lloyd & Eisenschenk

(57) ABSTRACT

A semiconductor module includes: a base substrate that includes a first dielectric film and an electrode layer, the first dielectric film having a mounting surface, the mounting surface including a first mounting area and a second mounting area; a first semiconductor part mounted on the first mounting area; and a second semiconductor part mounted on the second mounting area, the second semiconductor part including a vertical power semiconductor device, a conductive block to be connected to the electrode layer, and a wiring substrate, the vertical power semiconductor device having a first surface and a second surface, the first surface including a first terminal to be connected to the electrode layer, the second surface including a second terminal, the wiring substrate electrically connecting the conductive block and the second terminal.

10 Claims, 8 Drawing Sheets

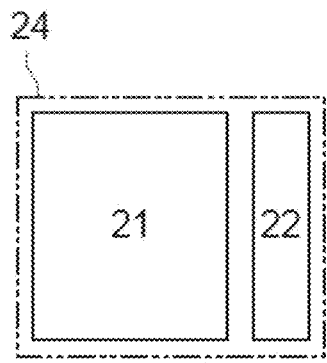 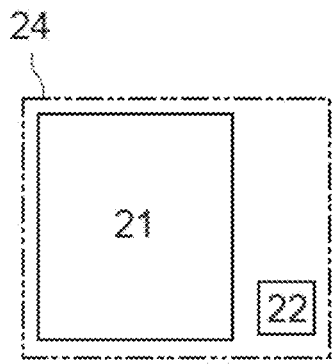 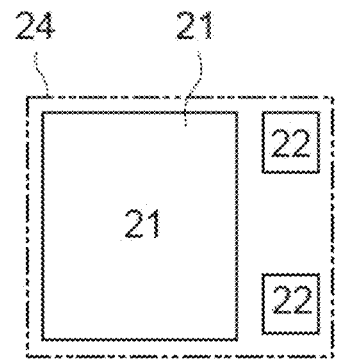
FIG.3A  FIG.3B  FIG.3C
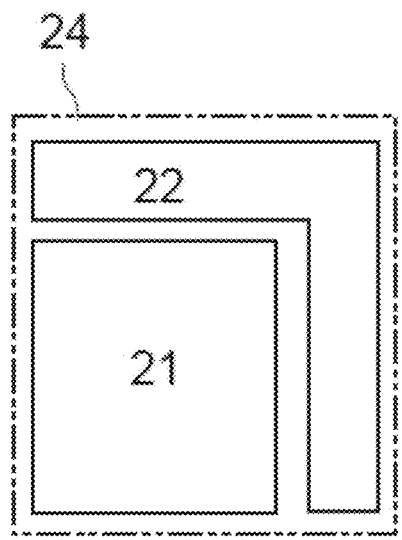 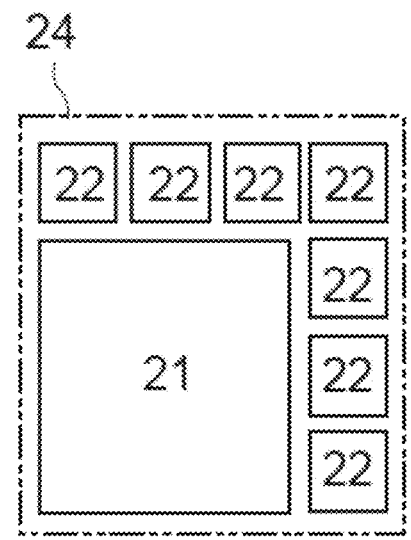
FIG.3D  FIG.3E

SEMICONDUCTOR MODULE

CROSS-REFERENCE TO RELATED APPLICATION

This application claims the benefit of Japanese Patent Application No. 2018-134845, filed Jul. 18, 2018, the entire contents of which are incorporated herein by reference.

BACKGROUND

The present disclosure relates to a semiconductor module including a vertical power semiconductor device.

In recent years, a surface mount integrated power module called POL (Power Over Lay) has been known. A semiconductor module of this type typically includes a dielectric film such as polyimide, a circuit part such as a power semiconductor device and a passive part mounted on one surface of the dielectric film, an electrode layer disposed on the other surface of the dielectric film, a sealing layer that covers the circuit part, and the like.

In accordance with the semiconductor module, the circuit part is electrically connected to the electrode layer via the dielectric film, and thus, it is possible to realize a power semiconductor module that achieves high integration of parts and shortening of the wiring length and that can be thinner and miniaturized while securing an insulation withstand voltage. Further, the design freedom of the electrode shape is high, and it is possible to form the electrode terminal in the power semiconductor device that controls passage of a large current into an arbitrary shape and size.

For example, Japanese Patent Application Laid-open No. 2015-170855 discloses a semiconductor device package in which a plurality of semiconductor devices are uniformly sealed with an embedding material between first and second dielectric layers each formed of a polyimide layer. In the first dielectric layer and the second dielectric layer, metal interconnects to be electrically connected to the front and rear surfaces of a semiconductor part are formed, thereby providing an electrical and thermal connection/path portion in the package structure.

SUMMARY

However, with the configuration disclosed in Japanese Patent Application Laid-open No. 2015-170855, in the case of arranging the plurality of semiconductor devices having different thicknesses on the first dielectric layer, it is necessary to match the thickness of each semiconductor device by using a spacer or the like because a gap is generated between a thinner semiconductor device and the second dielectric layer. Meanwhile, in the case of filling the gap with an embedding material and forming a via in the filled area, a problem of the increase in man-hours and complexity of processes occurs.

In view of the circumstances as described above, it is desirable to provide a semiconductor module capable of easily performing electrical connection of a semiconductor device having a thickness different from those of other parts to the front and rear surfaces.

In accordance with an embodiment of the present disclosure, there is provided a semiconductor module including: a base substrate; a first semiconductor part; and a second semiconductor part.

The base substrate includes a first dielectric film and an electrode layer, the first dielectric film having a mounting surface, the mounting surface including a first mounting area and a second mounting area.

The first semiconductor part is mounted on the first mounting area.

The second semiconductor part is mounted on the second mounting area. The second semiconductor part includes a vertical power semiconductor device, a conductive block, and a wiring substrate. The vertical power semiconductor device has a first surface and a second surface, the first surface including a first terminal to be connected to the electrode layer, the second surface including a second terminal. The conductive block is to be connected to the electrode layer. The wiring substrate electrically connects the conductive block and the second terminal.

In the semiconductor module, the second semiconductor part electrically connects the first and second terminal of the vertical power semiconductor device to the electrode layer via the conductive block and the wiring substrate. As a result, even in the case where the second semiconductor part has a thickness different from that of the first semiconductor part, it is possible to easily perform electrical connection to the first terminal and the second terminal.

The wiring substrate may include a second dielectric film and a wiring layer provided on the second dielectric film, the second dielectric film supporting the vertical power semiconductor device and the conductive block, the wiring layer connecting the conductive block and the second terminal.

The conductive block may include a plurality of conductive blocks that is supported by the second dielectric film and disposed around the vertical power semiconductor device. In this case, at least one of the plurality of conductive blocks may electrically connect the electrode layer and the second terminal.

The first dielectric film and the second dielectric film may each be a polyimide film.

The vertical power semiconductor device may further include a third terminal. The third terminal is connected to the electrode layer and controls electrical connection between the first terminal and the second terminal.

The second semiconductor part may be a package part that includes a package main body, the package main body sealing the vertical power semiconductor device, the conductive block, and the wiring substrate.

The semiconductor module may further include a sealing layer that seals at least one of the first mounting area and the second mounting area.

The semiconductor module may further include a partition wall member. The partition wall member is disposed on the mounting surface and divides the first mounting area and the second mounting area.

The sealing layer may include a first sealing portion and a second sealing portion, the first sealing portion sealing the first mounting area, the second sealing portion sealing the second mounting area.

The first dielectric film may further have an electrode forming surface opposed to the mounting surface.

The electrode layer is provided on the electrode forming surface and electrically connected to the first semiconductor part and the second semiconductor part via the first dielectric film.

As described above, in accordance with the present disclosure, it is possible to easily perform electrical connection of a semiconductor device having a thickness different from those of other parts to the front and rear surfaces.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 3A to 3G are schematic diagrams showing a configuration example of an internal structure of a second semiconductor part in the semiconductor module;

DETAILED DESCRIPTION OF EMBODIMENTS

Hereinafter, embodiments of the present disclosure will be described with reference to the drawings.

First Embodiment

Figure 1:
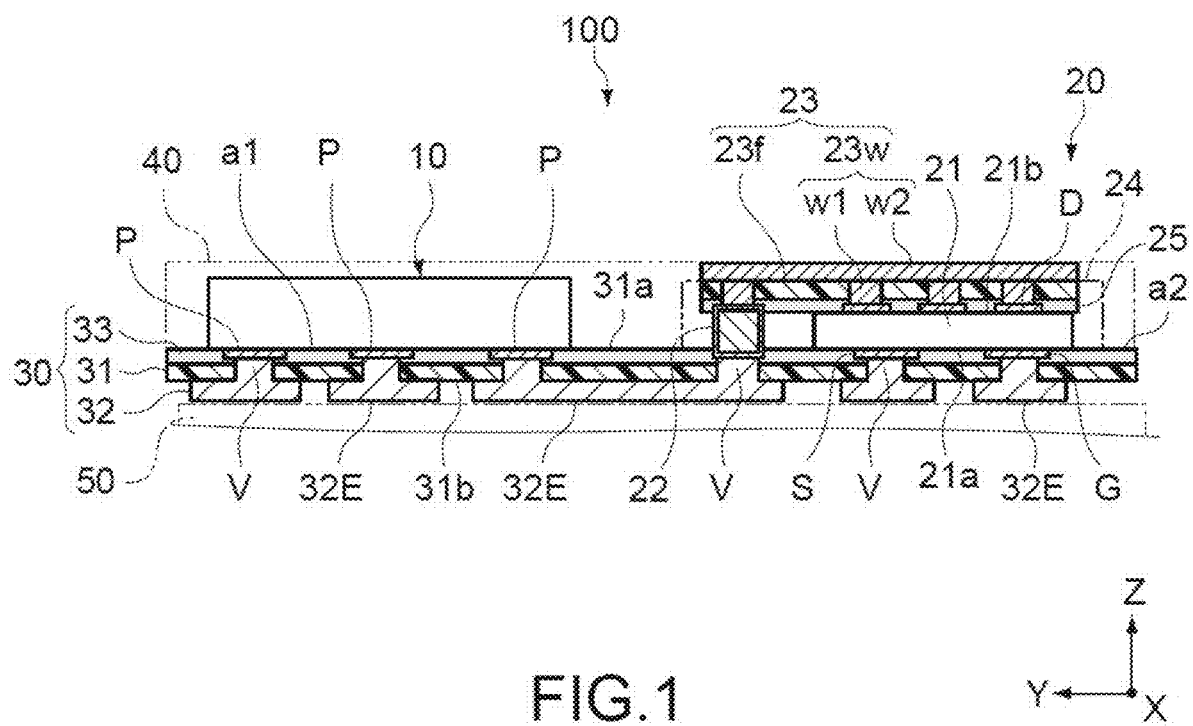
FIG. 1 is a schematic cross-sectional view showing a configuration of a semiconductor module according to a first embodiment of the present disclosure.
Figure 2:
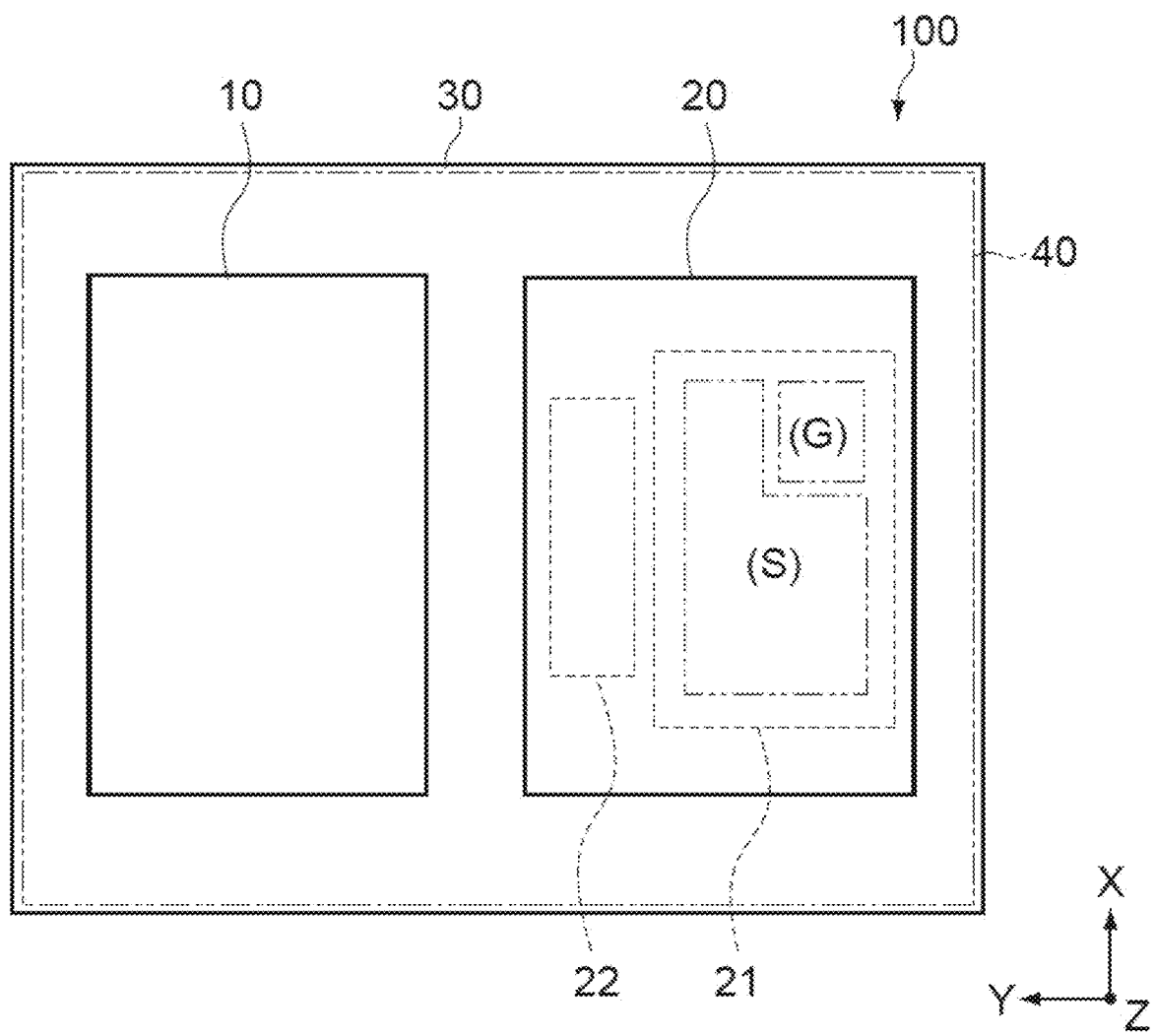
FIG. 2 is a schematic plan view of the semiconductor module shown in FIG. 1.

FIG. 1 is a schematic cross-sectional view showing a configuration of a semiconductor module 100 according to a first embodiment of the present disclosure. FIG. 2 is a schematic plan view of the semiconductor module 100 shown in FIG. 1. In each figure, the X axis, Y axis, and Z axis represent three axis directions orthogonal to each other, and the Z axis corresponds to the thickness (height) direction of the semiconductor module 100.

The semiconductor module 100 according to this embodiment includes a first semiconductor part 10, a second semiconductor part 20, and a base substrate 30 that supports them.

The base substrate 30 includes a dielectric film 31 (first dielectric film). The dielectric film 31 is formed of an electrically insulating resin material having flexibility and a predetermined thickness. In this embodiment, the dielectric film 31 includes a polyimide film having a thickness of 25 µm. Polyimide is very advantageous from the viewpoints of processability, insulation withstand voltage characteristics, chemical resistance, and the like.

The present disclosure is not limited thereto, and the thickness of the dielectric film 31 can be appropriately set in accordance with the dielectric constant of the material, the necessary magnitude of the insulation withstand voltage, or the like. For example, the thickness of the dielectric film 10 is appropriately selected within the range of not more than 20 µm and not less than 50 µm. The dielectric material is also not limited to polyimide. For example, an appropriate material such as polytetrafluoroethylene (PTFE), polysulfone, and a liquid crystal polymer can be adopted.

Also the shape of the dielectric film 31 is not particularly limited. The dielectric film 31 is typically formed in a rectangular shape (see FIG. 2). The size of the dielectric film 31 on the plane is not particularly limited as long as the first semiconductor part 10 and the second semiconductor part 20 can be mounted thereon. For example, the dielectric film 31 has lengths of sides parallel to the X-axis direction and the Y-axis direction of not less than 10 mm and not more than 500 mm.

The dielectric film 31 has a mounting surface 31a and an electrode forming surface 31b opposite to the mounting surface 31a. The first semiconductor part 10 and the second semiconductor part 20 are to be mounted on the mounting surface 31a. The mounting surface 31a includes a first mounting area a1 and a second mounting area a2. The first semiconductor part 10 is to be mounted on the first mounting area a1. The second semiconductor part 20 is to be mounted on the second mounting area a2. The part to be mounted on the mounting surface 31a is not limited to the first semiconductor part 10 and the second semiconductor part 20, and may include a control IC that drives them, a passive part such as a capacitor, and the like. Hereinafter, the part to be mounted on the mounting surface 31a will be referred to also as "circuit part".

A plurality of circuit parts including the first semiconductor part 10 and the second semiconductor part 20 is mounted on the mounting surface 31a via the adhesive layer 33, and an electrode layer 32 to be electrically connected to the above-mentioned circuit part is disposed on the electrode forming surface 31b via the dielectric film 31.

The adhesive layer 33 includes a liquid adhesive, a fluid adhesive, or a film-like adhesive sheet applied to the mounting surface 31a. The type of the adhesive layer 33 is not particularly limited. The adhesive layer 33 is formed of an appropriate insulating resin material such as an epoxy resin material and an acrylic resin material. The thickness of the adhesive layer 33 is not particularly limited, and is, for example, 15 µm. Further, it is favorable that the adhesive layer 33 has high heat resistance in consideration of temperature rise during driving. Note that the adhesive layer 33 may be provided on the entire surface of the mounting surface 31a or may be selectively provided in the mounting area of the circuit part.

The electrode layer 32 is disposed on the electrode forming surface 31b in the dielectric film 31, and typically includes a metal plating layer containing copper (Cu) or the like as a main component. The electrode layer 32 includes a via V as an interlayer connection portion to be electrically connected to the above-mentioned circuit part via the dielectric film 31.

When forming the electrode layer 32, first, laser light is applied from the side of the electrode forming surface 31b to the electrode terminal of each circuit part (the first semiconductor part 10 and the second semiconductor part 20) mounted on the mounting surface 31a of the dielectric film 31. As a result, the dielectric film 31 and the adhesive layer 33 are drilled, and each electrode terminal is exposed to the side of the electrode forming surface 31b. Subsequently, a conductor layer to be a seed layer is formed on the electrode forming surface 31b by a sputtering method, and then, a cupper plating layer having a predetermined thickness is formed by an electrolytic plating method. As a result, the electrode layer 32 including the via V to be connected to the circuit part is formed.

For the formation of the conductor layer to be a seed layer, the sputtering method does not necessarily need to be adopted, and an electroless plating method may be adopted. The thickness (thickness from the electrode forming surface 31b) of the electrode layer 32 is not particularly limited, and is, for example, not less than approximately 50 µm and not more than 100 µm. As a result, the current characteristics of the electrode layer 32 and productivity can be secured.

Further, the thicker the electrode layer 32 the larger the current that can be handled and the better the heat dissipation. Therefore, it is possible to cause the electrode layer 32 to function as the heat sink for the heat generated from the circuit part and as the heat radiation electrode.

Note that in the case where the electrode layer 32 is formed of Cu plating, it is favorable to provide at least one anti-oxidation film on the surface. Examples of the material of the film include Ni, Ni/Au, and Ni/Pd/Au. The electrode layer 32 functions as an eternal terminal to be mounted on a motherboard 50 via a bonding material such as solder.

As the plating method to be used for forming the electrode layer 32, a subtractive method of forming a plating layer on the entire dielectric film 31 and then removing a part thereof other than necessary portions, and an additive method (sub-additive method) of selectively plating only necessary portions via a plating resist formed on the dielectric film 31 can be adopted. The former is used here, and the electrode layer 32 is patterned into a plurality of electrode portions 32E having a predetermined shape by using a photolithographic technology.

The first semiconductor part 10 is mounted on the first mounting area a1 of the mounting surface 31a, and held by the adhesive layer 33. The first semiconductor part 10 typically includes an IC part. The first semiconductor part 10 may be a bare chip part or a package part. On the active surface (surface facing the mounting surface 31a) of the first semiconductor part 10, a plurality of electrode pads P to be connected to the via V of the electrode layer 32 is arranged.

On the non-active surface (surface opposed to the active surface) of the first semiconductor part 10, a heat sink for heat radiation may be bonded via a bonding material such as solder. This heat sink mainly contains a conductive material such as Cu and Al as a main component, and may be a metal plate or a thick metal/alloy film formed by plating or sputtering. Further, for heat radiation, a substrate referred to as DBC (DBA) in which Cu is bonded to a ceramic substrate may be bonded to the above-mentioned non-active surface.

The second semiconductor part 20 is mounted on the second mounting area a2 of the mounting surface 31a, and held by the adhesive layer 33. The second semiconductor part 20 includes a vertical power semiconductor device 21, a conductive block 22, and a wiring substrate 23.

The vertical power semiconductor device 21 (hereinafter, also referred to simply as "a semiconductor device") is a power transistor for large current, which flows current in the thickness direction of the device. However, the vertical power semiconductor device 21 is not limited to thereto, and may be another power semiconductor device such as a power diode. Examples of the power transistor include a bipolar transistor, MOSFET, and IGBT formed of Si, SiC, GaN, or the like. The second semiconductor part 20 may be a bare chip part or a package part.

The semiconductor device 21 has a first surface 21a and a second surface 21b opposed to the first surface 21a. The first surface 21a faces the mounting surface 31a. The first surface 21a includes a the first terminal S to be connected to the electrode layer 32, and the second surface 21b includes a second terminal D that is electrically connectable to the first terminal S. The first surface 21a further includes a third terminal G that controls electrical connection between the first terminal S and the second terminal D.

Note that the first terminal S and the second terminal D are each a conduction terminal through which large current flows out or flows in, and respectively correspond to a source terminal and a drain terminal. The second terminal D includes a plurality of second terminals D, and the second terminals D are arranged on the second surface 21b of the semiconductor device 21. The third terminal G corresponds to a gate terminal as a control terminal, and is electrically connected to an electrode portion for a gate terminal in the electrode layer 32. The second terminal D is electrically connected to a part of the plurality of electrode pads P of the first semiconductor part 10 via the wiring substrate 23, the conductive block 22, and the electrode layer 32.

The conductive block 22 typically includes a metal block formed of a good electrical conductor such as Cu.

The conductive block 22 is disposed around the semiconductor device 21. On end of the conductive block 22 is connected to a predetermined via V of the mounting surface 31a, and the other end thereof is connected to a wiring layer 23w of the wiring substrate 23. The conductive block 22 is formed to have a thickness that is the same or substantially the same as that of the semiconductor device 21. As a result, it is possible to perform electrical connection between the conductive block 22 and the semiconductor device 21 without largely deforming the wiring substrate 23.

The surface of the conductive block 22 is coated with a metal film (plating) formed of Sn, Ni, Ag, or the like. The film is formed on the entire surface of the conductive block 22. However, the present disclosure is not limited thereto, and the film may be formed on only two surfaces connected to the via V of the mounting surface 31a and the wiring layer 23w of the wiring substrate 23. In this case, the conductive block 22 having the film can be prepared by dicing a Cu plate having the film on both surfaces is formed.

The wiring substrate 23 has a stacked structure of a dielectric film 23f (second dielectric film) and the wiring layer 23w.

The dielectric film 23f is formed of an electrically insulating resin material having flexibility and a predetermined thickness, similarly to the dielectric film 31 constituting the base substrate 30. In this embodiment, the dielectric film 23f is formed of a polyimide film having a thickness of 25 μm. Polyimide is very advantageous from the viewpoints of processability, insulation withstand voltage characteristics, chemical resistance, and the like.

The present disclosure is not limited thereto, and the thickness of the dielectric film 23f can be appropriately set in accordance with the dielectric constant of the material, the necessary magnitude of the insulation withstand voltage, or the like. For example, the thickness of the dielectric film 23f is appropriately selected within the range of not more than 20 μm and not less than 50 μm. The dielectric material is also not limited to polyimide. For example, an appropriate material such as polytetrafluoroethylene (PTFE), polysulfone, and a liquid crystal polymer can be adopted.

Also the shape of the dielectric film 23f is not particularly limited. The dielectric film 23f is typically formed in a rectangular shape. The size of the dielectric film 23f on the plane is not particularly limited as long as favorable electrical connection between the second surface 21b of the semiconductor device 21 and the conductive block 22 can be secured. For example, the dielectric film 23f may be a strip-like film that partially connects the second terminal D and the conductive block 22, or a wide film that comprehensively connects the entire area of the second surface 21b and the conductive block 22.

The dielectric film 23f holds the semiconductor device 21 via an adhesive layer 25. The adhesive layer 25 includes a liquid adhesive, a fluid adhesive, or a film-like adhesive sheet applied to the dielectric film 23f The type of the adhesive layer 25 is not particularly limited. The adhesive layer 25 is formed of an appropriate insulating resin material such as an epoxy resin material and an acrylic resin material. The thickness of the adhesive layer 25 is not particularly limited, and is, for example, 15 μm. Further, it is favorable that the adhesive layer 25 has high heat resistance in consideration of temperature rise during driving. Note that the adhesive layer 25 may be provided on the entire surface of the dielectric film 23f or may be selectively provided in the mounting area of the semiconductor device 21.

The wiring layer 23w is provided on the dielectric film 23f, and electrically connects the conductive block 22 and the second terminal D of the semiconductor device 21. In this embodiment, the wiring layer 23w includes a plurality of vias w1 and a metal layer w2. The plurality of vias w1 is connected to the semiconductor device 21 and the conductive block 22, and penetrates the dielectric film 23f. The metal layer w2 is provided on the main surface of the dielectric film 23f, which is opposed to the side of the adhesive layer 25, and connects the plurality of vias w1 to each other.

The wiring layer 23w can be formed by a method similar to the method of forming the electrode layer 32. Laser light is applied from the surface of the dielectric film 23f, which is opposed to the side of the adhesive layer 25, to the second terminal D of the semiconductor device 21 mounted on the adhesive layer 25 of the dielectric film 23f. As a result, the dielectric film 23f and the adhesive layer 25 are drilled, and the second terminal D is exposed. Subsequently, a conductor layer to be a seed layer is formed on the above-mentioned opposed surface of the dielectric film 23f by a sputtering method, and then, a cupper plating layer having a predetermined thickness is formed by an electrolytic plating method. As a result, the metal layer w2 including the vias w1 to be connected to the semiconductor device 21 is formed. The thickness of the metal layer w2 is not particularly limited. As the thickness is larger, the function as a heat sink for improving the heat radiation effect of the semiconductor device 21 can be improved.

By forming the wiring layer 23w including the vias w1 and the metal layer w2 on the dielectric film 23f, the second terminal D of the semiconductor device 21 can be electrically connected to the electrode layer 32 via the wiring layer 23w and the conductive block 22. Further, since the semiconductor device 21 is sandwiched between the electrode layer 32 on the side of the base substrate 30 and the metal layer w2 on the side of the wiring substrate 23, it is possible to dramatically improve the heat dissipation of the semiconductor device 21 and stably drive the semiconductor device 21 by forming the electrode layer 32 and the metal layer w2 to have a relatively large thickness.

The conductive block 22 is supported by the wiring substrate 23. The number of the conductive blocks 22 may be one or two or more. Also the shape of the conductive block 22 is not particularly limited. The conductive block 22 may be a columnar block body such as a prismatic block body and a cylindrical block body, or may be a longitudinal, L-shaped, or annular block body continuous in at least one axis direction.

FIGS. 3A to 3G are schematic plan views showing some examples of the form of the conductive block 22 on the mounting surface.

Figure 3F:
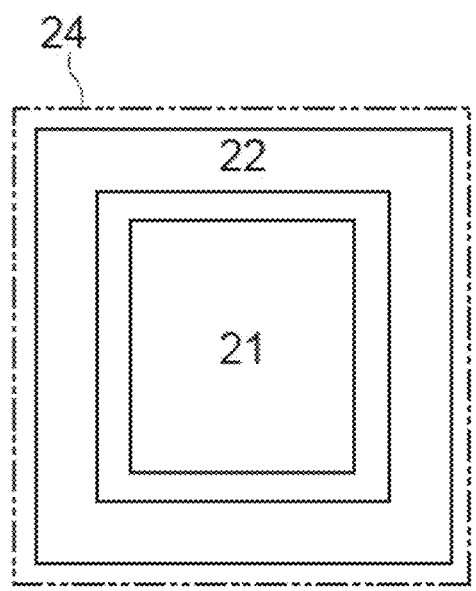
Figure 3G:
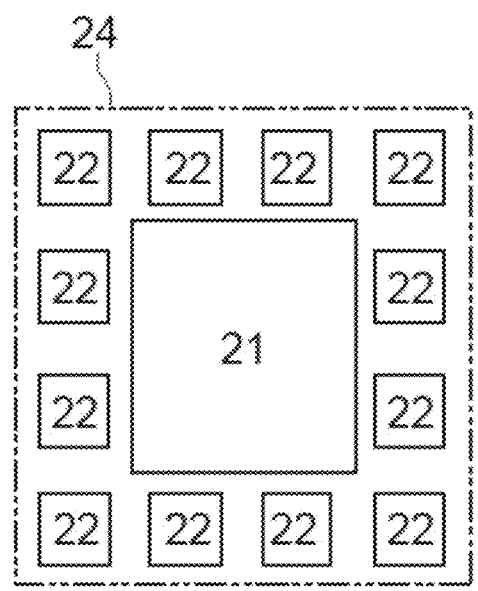

FIG. 3A shows an example in which a conductive block 22 which is longitudinal is disposed along one side of the semiconductor device 21. FIG. 3B and FIG. 3C respectively show an example in which one conductive block 22 which is columnar is disposed along one side of the semiconductor device 21 and an example in which two conductive blocks 22 which are columnar are disposed along one side of the semiconductor device 21. FIG. 3D and FIG. 3E respectively show an example in which a conductive block 22 which is L-shaped is disposed along two adjacent sides of the semiconductor device 21 and an example in which a plurality of conductive blocks 22 which are L-shaped are disposed along two adjacent sides of the semiconductor device 21. FIG. 3F and FIG. 3G respectively show an example in which a conductive block 22 which is rectangular and annular is disposed around the semiconductor device 21 and an example in which a plurality of conductive blocks 22 which are columnar are disposed around the semiconductor device 21. Note that in each figure, a reference symbol 24 indicates a package main body (described below).

Since the conductive block 22 includes a metal block formed of Cu or the like, the conductive block 22 has a function as a heat sink that absorbs heat from the semiconductor device 21 in addition to the function as an electrode. In this case, although FIGS. 3C, 3E, and 3G each show an example in which the plurality of conductive block 22 are disposed, the wiring layer 23w may be formed so that at least one of the plurality of conductive blocks 22 electrically connects the electrode layer 32 and the second terminal D. In this case, the conductive block 22 that is not connected to the second terminal D functions as a dummy terminal.

The second semiconductor part 20 may further include a package main body 24. As a result, the handleability of the second semiconductor part 20 is improved, and the mountability to the base substrate 30 and the sealability of the semiconductor device 21 can be enhanced. In this case, from the viewpoint of the heat dissipation, the package main body 24 may be formed such that the metal layer w2 or the conductive block 22 is exposed to the outside.

The second semiconductor part 20 is formed to have a thickness larger than that of the first semiconductor part 10 as shown in FIG. 1. However, the present disclosure is not limited thereto, and the second semiconductor part 20 may have a thickness smaller than that of the first semiconductor part 10 or a thickness that is the same as that of the first semiconductor part 10. Further, also the planar shape and size of the second semiconductor part 20 are not particularly limited. As shown in FIG. 2, the second semiconductor part 20 may be formed to have the same shape and size as those of the first semiconductor part 10 or a shape different from that of the first semiconductor part 10 and a size larger or smaller than that of the first semiconductor part 10.

The semiconductor module 100 further includes a sealing layer 40 that seals at least one of the first mounting area a1 and the second mounting area a2. In this embodiment, the sealing layer 40 is provided on the entire area of the mounting surface 31a, which includes the first mounting area a1 and the second mounting area a2.

The sealing layer 40 is typically formed of an epoxy synthetic resin material, and inhibits outside air containing water and the like from coming into contact with the first semiconductor part 10 and the second semiconductor part 20. In this embodiment, the thickness of the sealing layer 40 is larger than the thickness of the first semiconductor part 10, and the same as or smaller than the thickness of the second semiconductor part 20. As a result, the sealing layer 40 is formed in the form of overmolding for the first semiconductor part 10, and exposes the metal layer w2 for the second semiconductor part 20, which makes it possible to enhance the heat dissipation of the semiconductor device 21.

The present disclosure is not limited thereto, and the sealing layer 40 may be formed to have such a thickness that the upper surface of the first semiconductor part 10 is exposed (expose molding). In this case, by using the upper surface of the exposed first semiconductor part 10 as a bonding area or the like of the heat sink, the heat dissipation of the first semiconductor part 10 can be enhanced. Further, the present disclosure is not limited to the above-mentioned example, and the sealing layer 40 may be formed to have a thickness capable of covering both the first semiconductor part 10 and the second semiconductor part 20.

In the semiconductor module 100 according to this embodiment configured as described above, the second semiconductor part 20 electrically connects the first and second terminals S and D to the electrode layer 32 via the conductive block 22 and the wiring substrate 23. As a result, also in the case where the second semiconductor part 20 has a thickness different from that of the first semiconductor part 10, it is possible to easily perform electrical connection to the first terminal S and the second terminal D.

Figure 4:
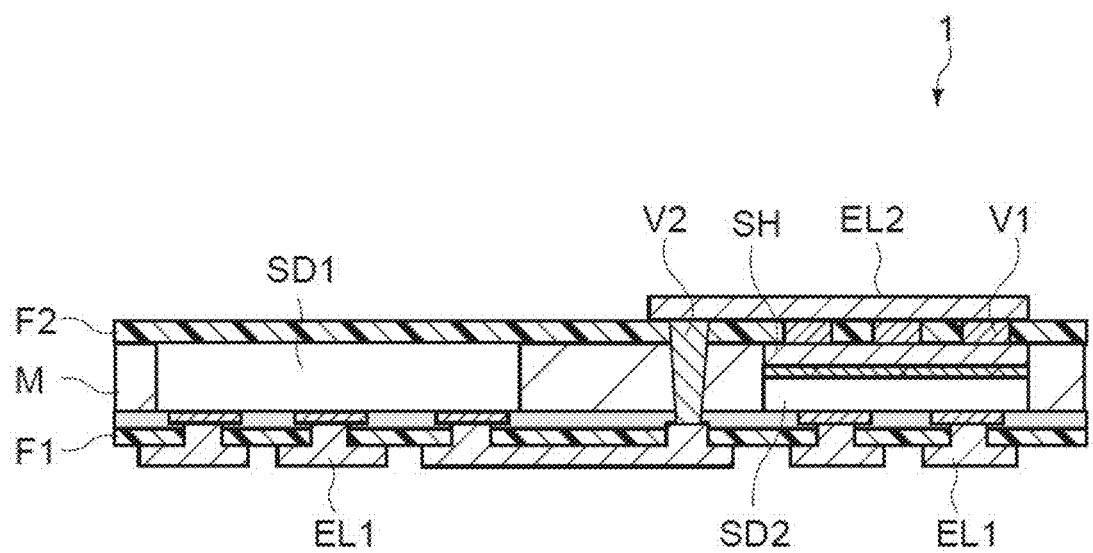
FIG. 4 is a schematic cross-sectional view showing a configuration of a semiconductor module according to a comparative example.

For example, as schematically shown FIG. 4, in a semiconductor module 1 in which two semiconductor devices SD1 and SD2 are sandwiched by a first dielectric film F1 and a second dielectric film F2, in the case where the semiconductor device SD2 is a vertical power semiconductor device, a wiring layer EL2 for drawing out via the via V1 to the terminal portion of the upper surface of the semiconductor device SD2 and an interlayer via V2 for connecting the wiring layer EL2 to an electrode layer EL1 on the first dielectric film F1 are provided on the second dielectric film F2. At this time, if the semiconductor device SD2 is thinner than the semiconductor device SD1, it is necessary to provide a spacer (shim SH) between the terminal portion of the upper surface of the semiconductor device SD2 and the second dielectric film F2 to match the thickness with the thickness of the semiconductor device SD1 because a gap is generated between the semiconductor device SD2 and the second dielectric film F2. Therefore, in the semiconductor module 1 having such a structure, in the case where the thicknesses of the semiconductor devices SD1 and SD2 differ, a problem of the increase in the number of wiring-forming steps of forming wiring for the electrode layer EL1 and complexity of processes occurs.

Meanwhile, in the semiconductor module 100 according to this embodiment, the second semiconductor part 20 includes the conductive block 22 and the wiring substrate 23 for electrically connecting the second terminal D of the vertical power semiconductor device 21 to the mounting surface 31a of the base substrate 30, which makes it easy to perform electrical connection of each terminal of the second semiconductor part 20 even in the case where the thickness of the second semiconductor part 20 is different from that of the first semiconductor part 10.

Further, by preparing the second semiconductor part 20 having the above-mentioned configuration in advance, it only needs to mount the second semiconductor part 20 and the first semiconductor part 10 on the base substrate 30 to produce the semiconductor module 100. Therefore, it is possible to simplify the configuration of the entire module, drastically reduce the number of production steps, and improve the yield because it is unnecessary to perform the process of forming wiring after mounting.

Further, in accordance with this embodiment, since the second semiconductor part 20 includes the wiring substrate 23 including the metal layer w2, the heat generating semiconductor device 21 mounted on the base substrate 30 can be sandwiched between the electrode layer 32 and the metal layer w2, and it is possible to improve the heat dissipation of the semiconductor device 21, enhance the deformation resistance of the semiconductor device 21 against the external stress or thermal stress, and secure stable driving of the semiconductor device 21.

Second Embodiment

Figure 5:
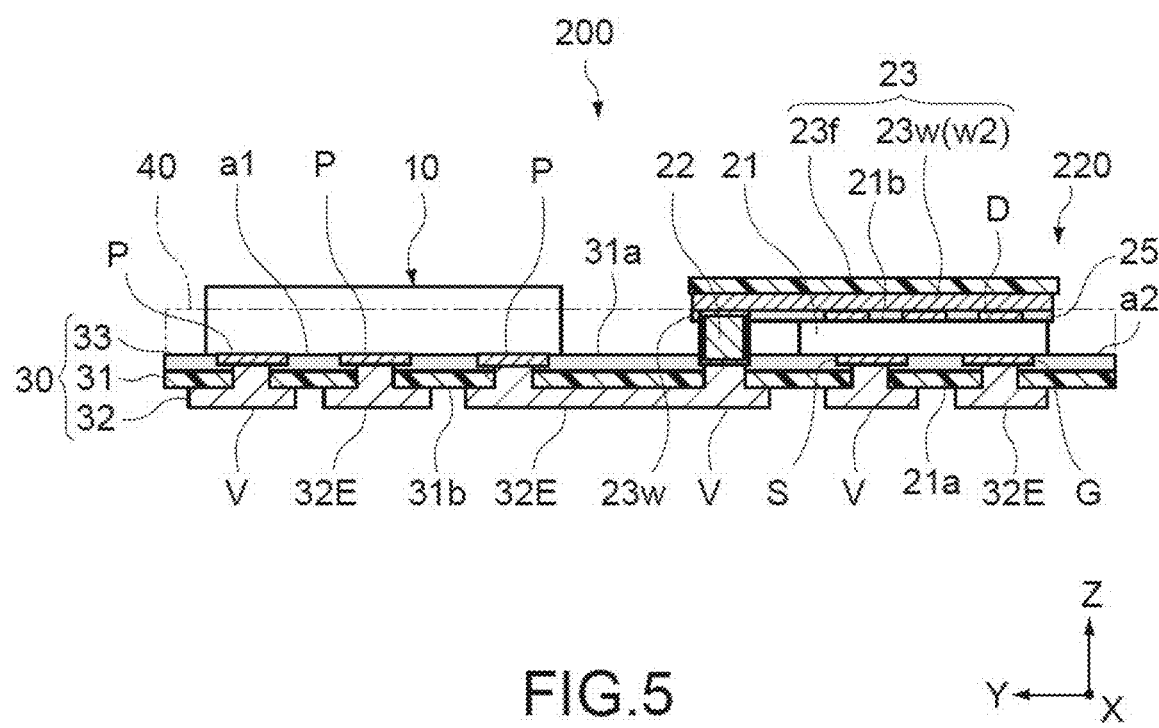
FIG. 5 is a schematic cross-sectional view showing a configuration of a semiconductor module according to a second embodiment of the present disclosure.

FIG. 5 is a schematic cross-sectional view showing a configuration of a semiconductor module 200 according to a second embodiment of the present disclosure. Hereinafter, the configuration different from that in the first embodiment will be mainly described, and the same configuration as that of the first embodiment will be denoted by the same reference symbol, and description thereof will be omitted or simplified.

The semiconductor module 200 according to this embodiment is different from the semiconductor module 100 according to the first embodiment in the configuration of a second semiconductor part 220. Specifically, in the second semiconductor part 220 according to this embodiment, the wiring layer 23w includes the metal layer w2 disposed between the dielectric film 23f and the semiconductor device 21, thereby connecting the wiring layer 23w directly to the second terminal D (drain terminal) of the semiconductor device 21 without vias. As a result, the metal layer w2 can be brought closer to the semiconductor device 21, and thus, it is possible to enhance the heat dissipation of the semiconductor device 21.

Third Embodiment

Figure 6:
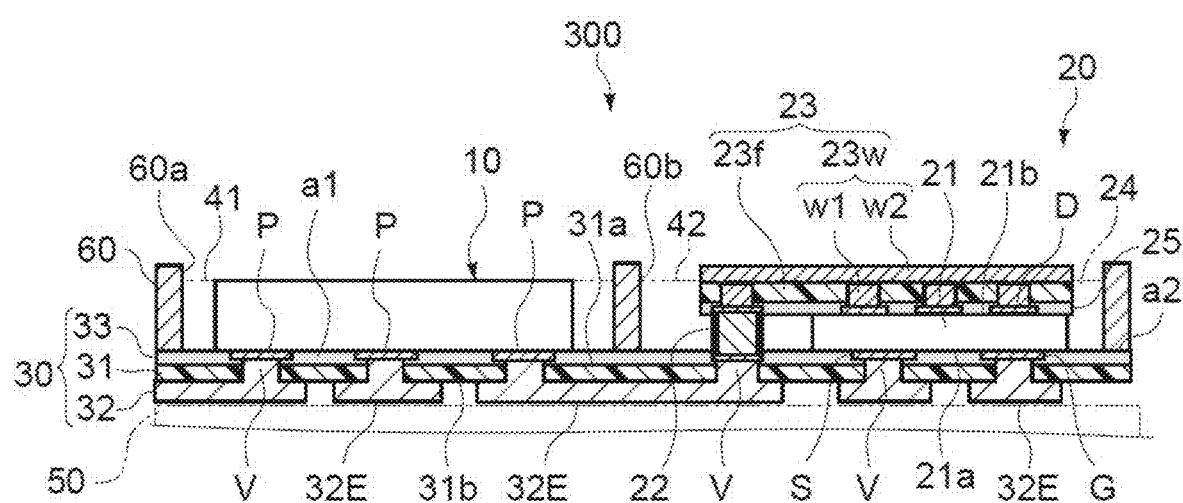
FIG. 6 is a schematic cross-sectional view showing a configuration of a semiconductor module according to a third embodiment of the present disclosure.
Figure 7:
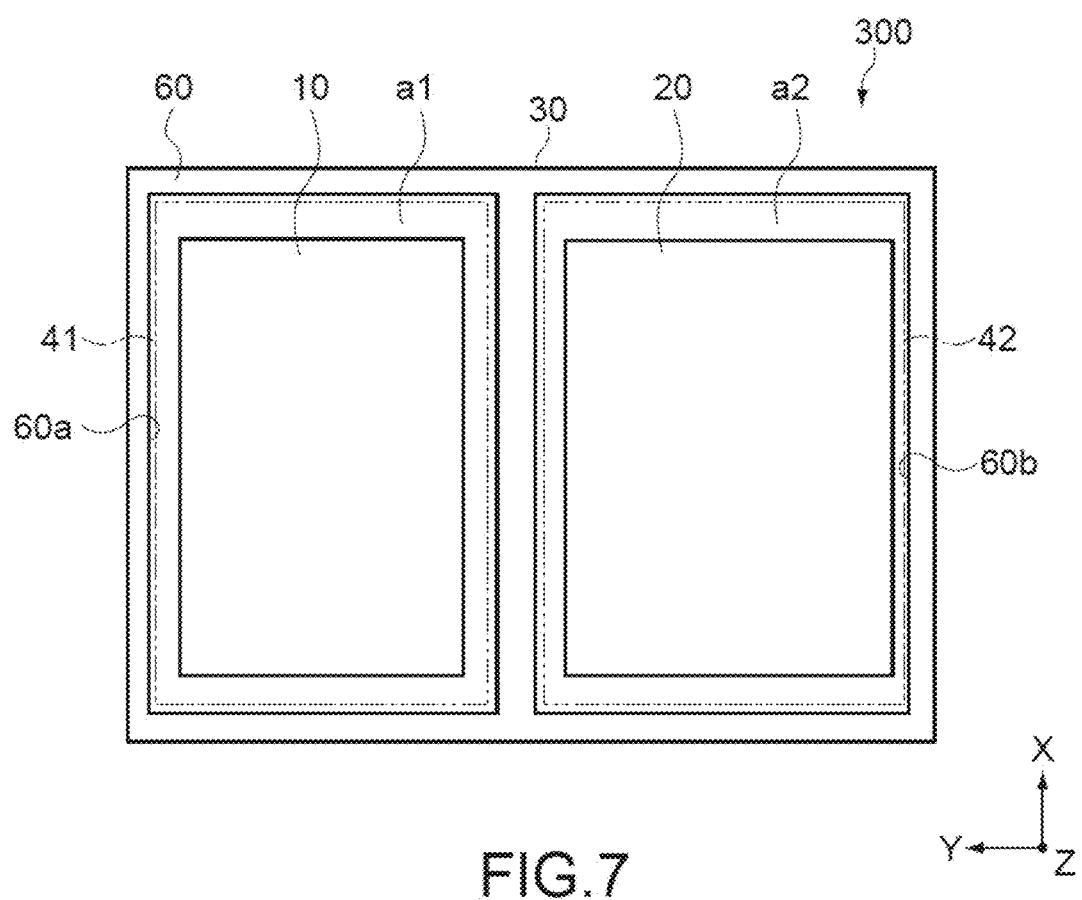
FIG. 7 is a schematic plan view of the semiconductor module shown in FIG. 6.

FIG. 6 is a schematic cross-sectional view showing a configuration of a semiconductor module 300 according to a third embodiment of the present disclosure. FIG. 7 is a schematic plan view of the semiconductor module shown in FIG. 6. Hereinafter, the configuration different from that in the first embodiment will be mainly described, and the same configuration as that of the first embodiment will be denoted by the same reference symbol, and description thereof will be omitted or simplified.

The semiconductor module 300 according to this embodiment includes the first semiconductor part 10, the second semiconductor part 20, and the base substrate 30 similarly to the semiconductor module 100 according to the first embodiment. The third embodiment is different from the first embodiment in that the semiconductor module 300 includes a partition wall member 60.

The partition wall member 60 is disposed on the mounting surface 31a of the base substrate 30, and divides the first mounting area a1 and the second mounting area a2. As shown in FIG. 7, the partition wall member 60 includes a rectangular frame including a first opening 60a and a second opening 60b. The first opening 60a houses the first semiconductor part 10. The second opening 60b houses the second semiconductor part 20. The partition wall member 60 is supported by the mounting surface 31a via the adhesive layer 33. A sealing portion may be selectively provided in any one of the first and second openings 60a and 60b, or a first sealing portion 41 and a second sealing portion 42 may respectively be provided in the first opening 60a and the second opening 60b. Alternatively, the first and second openings 60 and 60b do not necessarily need to be filled with a sealing portion, and may form a space.

For example, in a power semiconductor device formed of a semiconductor material such as Si, GaN, SiC, $Ga_2O_3$, and diamond, the device characteristics deteriorate due to the cure shrinkage stress of a resin forming the sealing layer, and it is difficult to secure desired module characteristics in some cases. Meanwhile, if the sealing layer is omitted or the sealing layer is formed of a soft resin material, it is difficult to suppress a warp of the base substrate 30.

In this regard, in this embodiment, by mounting the frame-shaped partition wall member 60 on the mounting surface 31a, the rigidity of the partition wall member 60 is used to suppress a warp and deformation of the base substrate 30. As a result, even in the case of providing no sealing portion, it is possible to effectively suppress a warp and deformation of the base substrate 30 by the partition wall member 60.

The material forming the partition wall member 60 is not particularly limited as long as it has such a rigidity that a warp of the first mounting area a1 can be suppressed. The material forming the partition wall member 60 may be a conductor or a non-conductor. The conductor is typically formed of a metal material. As a result, a heat radiation path of the circuit part (particularly, the power second semiconductor part 20 in this embodiment) can be formed. The metal material is not particularly limited, and a material such as copper (Cu) having a high thermal conductivity and a small thermal expansion coefficient is favorable. As the partition wall member 60, a metal having a high hardness or high melting point such as tungsten (W) and molybdenum (Mo) or an alloy material such as Cu—W and Cu—Mo may be adopted. As a result, it is possible to easily secure desired rigidity. Meanwhile, ceramic materials such as alumina, silica, and boron nitride are favorable as the non-conductor.

The shape of the partition wall member 60 is not limited to the rectangle shape, and may be a circular or elliptical frame shape. Further, the shape of the partition wall member 60 is not limited to the frame shape. An appropriate shape such as a linear shape, an L-shape, and a cross shape can be adopted. By forming the partition wall member 60 so that it is exposed from the side surface of the module, it is possible to form a semiconductor module having excellent heat dissipation.

For the first sealing portion 41, a general-purpose epoxy synthetic resin material can be used. Meanwhile, for the second sealing portion 42, an epoxy synthetic resin material that is softer (having a lower elastic modulus) than the first sealing portion 41, e.g., a silicone resin or an epoxy resin having a low stress may be used. As a result, it is possible to inhibit the semiconductor device 21 that is a power semiconductor device from deteriorating due to the cure shrinkage stress of a resin. A gel-like material having the Young's modulus of not more than 0.01 MPa at room temperature or a material having a Tg close to room temperature can be used as the resin material forming the second sealing portion 42.

As described above, also in the semiconductor module 300 according to this embodiment, effect similar to those in the first embodiment can be achieved. In accordance with this embodiment, it is possible to suppress degradation of the device characteristics of the semiconductor parts 10 and 20 due to the stress of a sealing resin while suppressing a warp of the base substrate 30.

Although embodiments of the present disclosure have been described above, the present disclosure is not limited to the above-mentioned embodiments, and various modifications can be made.

For example, although in the above-mentioned embodiments, the semiconductor modules 100 and 200 in which the first and second semiconductor parts 10 and 20 are mounted on the base substrate 30 have been described as examples, parts to be mounted are not limited thereto, and an IC part and a passive part such as a capacitor for control may be mounted together.

Further, although the partition wall member 60 has included a common frame member surrounding the first and second mounting areas in the above-mentioned third embodiment, separate frame members may be used.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor module, comprising:
a base substrate that includes a first dielectric film and an electrode layer, the first dielectric film having a mounting surface, the mounting surface including a first mounting area and a second mounting area;
a first semiconductor part mounted on the first mounting area; and
a second semiconductor part mounted on the second mounting area, the second semiconductor part including a vertical power semiconductor device, a conductive block to be connected to the electrode layer, and a wiring substrate, the vertical power semiconductor device having a first surface and a second surface, the first surface including a first terminal to be connected to the electrode layer, the second surface including a second terminal, and the wiring substrate electrically connecting the conductive block and the second terminal,
wherein the wiring substrate includes a second dielectric film and a wiring layer provided on the second dielectric film, the second dielectric film supporting the vertical power semiconductor device and the conductive block, and the wiring layer connecting the conductive block and the second terminal, and
wherein the wiring layer includes a plurality of vias connected to the vertical power semiconductor device and the conductive block, and a metal layer provided on the second dielectric film, the plurality of vias penetrating the second dielectric film, and the metal layer connecting the plurality of vias to each other.

2. A semiconductor module, comprising:
a base substrate that includes a first dielectric film and an electrode layer, the first dielectric film having a mounting surface, the mounting surface including a first mounting area and a second mounting area;
a first semiconductor part mounted on the first mounting area; and
a second semiconductor part mounted on the second mounting area, the second semiconductor part including a vertical power semiconductor device, a conductive block to be connected to the electrode layer, and a wiring substrate, the vertical power semiconductor device having a first surface and a second surface, the first surface including a first terminal to be connected to the electrode layer, the second surface including a second terminal, and the wiring substrate electrically connecting the conductive block and the second terminal,
wherein the wiring substrate includes a second dielectric film and a wiring layer provided on the second dielectric film, the second dielectric film supporting the vertical power semiconductor device and the conductive block, and the wiring layer connecting the conductive block and the second terminal, and wherein the wiring layer includes a plurality of terminal portions and a metal layer, the plurality of terminal portions being connected to the vertical semiconductor device and the conductive block, the metal layer being disposed between the plurality of terminal portions and the second dielectric film.

3. A semiconductor module, comprising:

a base substrate that includes a first dielectric film and an electrode layer, the first dielectric film having a mounting surface, the mounting surface including a first mounting area and a second mounting area;

a first semiconductor part mounted on the first mounting area; and a second semiconductor part mounted on the second mounting area, the second semiconductor part including a vertical power semiconductor device, a conductive block to be connected to the electrode layer, and a wiring substrate, the vertical power semiconductor device having a first surface and a second surface, the first surface including a first terminal to be connected to the electrode layer, the second surface including a second terminal, and the wiring substrate electrically connecting the conductive block and the second terminal, wherein the wiring substrate includes a second dielectric film and a wiring layer provided on the second dielectric film, the second dielectric film supporting the vertical power semiconductor device and the conductive block, and the wiring layer connecting the conductive block and the second terminal, and wherein the conductive block includes a plurality of conductive blocks that is supported by the second dielectric film and disposed around the vertical power semiconductor device, and at least one of the plurality of conductive blocks electrically connects the electrode layer and the second terminal.

4. A semiconductor module, comprising:

a base substrate that includes a first dielectric film and an electrode layer, the first dielectric film having a mounting surface, the mounting surface including a first mounting area and a second mounting area;

a first semiconductor part mounted on the first mounting area; and a second semiconductor part mounted on the second mounting area, the second semiconductor part including a vertical power semiconductor device, a conductive block to be connected to the electrode layer, and a wiring substrate, the vertical power semiconductor device having a first surface and a second surface, the first surface including a first terminal to be connected to the electrode layer, the second surface including a second terminal, and the wiring substrate electrically connecting the conductive block and the second terminal, wherein the wiring substrate includes a second dielectric film and a wiring layer provided on the second dielectric film, the second dielectric film supporting the vertical power semiconductor device and the conductive block, and the wiring layer connecting the conductive block and the second terminal, and wherein the first dielectric film and the second dielectric film are each a polyimide film.

5. A semiconductor module, comprising:

a base substrate that includes a first dielectric film and an electrode layer, the first dielectric film having a mounting surface, the mounting surface including a first mounting area and a second mounting area;

a first semiconductor part mounted on the first mounting area; and a second semiconductor part mounted on the second mounting area, the second semiconductor part including a vertical power semiconductor device, a conductive block to be connected to the electrode layer, and a wiring substrate, the vertical power semiconductor device having a first surface and a second surface, the first surface including a first terminal to be connected to the electrode layer, the second surface including a second terminal, and the wiring substrate electrically connecting the conductive block and the second terminal, wherein the vertical power semiconductor device further includes a third terminal that is connected to the electrode layer and controls electrical connection between the first terminal and the second terminal.

6. A semiconductor module, comprising:

a base substrate that includes a first dielectric film and an electrode layer, the first dielectric film having a mounting surface, the mounting surface including a first mounting area and a second mounting area;

a first semiconductor part mounted on the first mounting area; and a second semiconductor part mounted on the second mounting area, the second semiconductor part including a vertical power semiconductor device, a conductive block to be connected to the electrode layer, and a wiring substrate, the vertical power semiconductor device having a first surface and a second surface, the first surface including a first terminal to be connected to the electrode layer, the second surface including a second terminal, and the wiring substrate electrically connecting the conductive block and the second terminal, wherein the wiring substrate includes a second dielectric film and a wiring layer provided on the second dielectric film, the second dielectric film supporting the vertical power semiconductor device and the conductive block, and the wiring layer connecting the conductive block and the second terminal, and wherein the second semiconductor part is a package part that includes a package main body, the package main body sealing the vertical power semiconductor device, the conductive block, and the wiring substrate.

7. The semiconductor module according to claim 1, further comprising a sealing layer that seals at least one of the first mounting area and the second mounting area.

8. A semiconductor module, comprising:

a base substrate that includes a first dielectric film and an electrode layer, the first dielectric film having a mounting surface, the mounting surface including a first mounting area and a second mounting area;

a first semiconductor part mounted on the first mounting area;

a second semiconductor part mounted on the second mounting area, the second semiconductor part including a vertical power semiconductor device, a conductive block to be connected to the electrode layer, and a wiring substrate, the vertical power semiconductor device having a first surface and a second surface, the first surface including a first terminal to be connected to the electrode layer, the second surface including a second terminal, and the wiring substrate electrically connecting the conductive block and the second terminal; and a partition wall member that is disposed on the mounting surface and divides the first mounting area and the second mounting area.

9. A semiconductor module, comprising:

a base substrate that includes a first dielectric film and an electrode layer, the first dielectric film having a mounting surface, the mounting surface including a first mounting area and a second mounting area;

a first semiconductor part mounted on the first mounting area;

a second semiconductor part mounted on the second mounting area, the second semiconductor part including a vertical power semiconductor device, a conductive block to be connected to the electrode layer, and a wiring substrate, the vertical power semiconductor device having a first surface and a second surface, the first surface including a first terminal to be connected to the electrode layer, the second surface including a second terminal, and the wiring substrate electrically connecting the conductive block and the second terminal; and a sealing layer that seals at least one of the first mounting area and the second mounting area, wherein the sealing layer includes a first sealing portion and a second sealing portion, the first sealing portion sealing the first mounting area, the second sealing portion sealing the second mounting area.

10. The semiconductor module according to claim 1, wherein the first dielectric film further has an electrode forming surface opposed to the mounting surface, and the electrode layer is provided on the electrode forming surface and electrically connected to the first semiconductor part and the second semiconductor part via the first dielectric film.

* * * * *